(12) United States Patent
Johnson (10) Patent No.: US 7,833,381 B2
(45) Date of Patent: Nov. 16, 2010

(54) OPTICAL EMISSION INTERFEROMETRY FOR PECVD USING A GAS INJECTION HOLE

(76) Inventor: David Johnson, 920 Belted Kingfisher Dr., Palm Harbor, FL (US) 34683

( * ) Notice: Subject to any disclaimer, the term of this patent is extended or adjusted under 35 U.S.C. 154(b) by 1133 days.

(21) Appl. No.: 11/502,585

(22) Filed: Aug. 10, 2006

(65) Prior Publication Data
US 2007/0039548 A1    Feb. 22, 2007

Related U.S. Application Data

(60) Provisional application No. 60/709,469, filed on Aug. 18, 2005.

(51) Int. Cl.
*C23F 1/00* (2006.01)
(52) U.S. Cl. .............. 156/345.25; 156/345.24; 156/345.4; 438/7; 438/710
(58) Field of Classification Search ............ 156/345.33, 156/345.34, 345.39, 345.4, 345.24, 345.25; 438/7, 710
See application file for complete search history.

(56) References Cited

U.S. PATENT DOCUMENTS

| | | | |
|---|---|---|---|
| 4,328,068 A | 5/1982 | Curtis | |
| 4,496,425 A | 1/1985 | Kuyel | |
| 4,948,259 A | 8/1990 | Enke et al. | |
| 5,223,914 A | 6/1993 | Auda et al. | |
| 5,242,532 A | 9/1993 | Cain | |
| 5,450,205 A | 9/1995 | Sawin et al. | |
| 5,578,161 A | 11/1996 | Auda | |
| 5,658,418 A | 8/1997 | Coronel et al. | |
| 5,807,761 A | 9/1998 | Coronel et al. | |
| 5,846,373 A | 12/1998 | Pirkle et al. | |
| 6,071,375 A | 6/2000 | Chen et al. | |
| 6,159,297 A | 12/2000 | Herchen et al. | |
| 6,203,620 B1 * | 3/2001 | Moslehi ............ | 156/345.35 |
| 6,264,852 B1 | 7/2001 | Herchen et al. | |
| 6,381,021 B1 * | 4/2002 | Somekh et al. .......... | 356/445 |
| 6,448,094 B2 | 9/2002 | Yamazawa et al. | |
| 6,641,747 B1 | 11/2003 | Lukanc et al. | |
| 6,758,941 B1 | 7/2004 | Ookawa et al. | |
| 6,815,653 B2 | 11/2004 | Tsay et al. | |
| 6,939,811 B2 | 9/2005 | Kamp et al. | |
| 6,977,184 B1 | 12/2005 | Chou et al. | |
| 7,001,529 B2 | 2/2006 | Han et al. | |
| 7,018,553 B2 | 3/2006 | Liu et al. | |
| 7,026,173 B2 | 4/2006 | Yamashita et al. | |
| 7,033,518 B2 | 4/2006 | Yang et al. | |
| 2001/0015175 A1 | 8/2001 | Masuda et al. | |

(Continued)

*Primary Examiner*—Lan Vinh
(74) *Attorney, Agent, or Firm*—Harvey Kauget; Phelps Dunbar LLP (57) ABSTRACT

The present invention provides a method and apparatus for improving optical sensing of a plasma process through the use of a fiber optic sensor placed within a standard showerhead hole of a standard gas showerhead positioned in an upper electrode of a plasma system during the plasma processing of a substrate. A film property can be calculated based on the measured plasma emission from the surface of the substrate. The film property can be film deposition rate, refractive index, film thickness, etc. Based on the measured film property, the plasma processing of the substrate can be adjusted and/or terminated. In addition, a window is provided that is positioned in the upper electrode assembly for viewing the plasma emission through the standard showerhead hole.

8 Claims, 9 Drawing Sheets

Showerhead Assembly Detail

U.S. PATENT DOCUMENTS

| | | |
|---|---|---|
| 2003/0038112 A1 | 2/2003 | Liu et al. |
| 2004/0040658 A1 | 3/2004 | Usui et al. |
| 2004/0084146 A1 | 5/2004 | Sekiya |
| 2004/0118517 A1 | 6/2004 | Masuda et al. |
| 2004/0118518 A1 | 6/2004 | Masuda et al. |
| 2004/0177925 A1 | 9/2004 | Masuda et al. |
| 2004/0191932 A1 | 9/2004 | Fuse |
| 2004/0197938 A1 | 10/2004 | Saito |
| 2004/0237888 A1 | 12/2004 | Codella et al. |
| 2005/0029228 A1 | 2/2005 | Nozawa et al. |
| 2005/0092435 A1* | 5/2005 | Hayashi et al. ........ 156/345.24 |
| 2005/0115824 A1* | 6/2005 | Donohue et al. ....... 204/192.12 |
| 2005/0154482 A1 | 7/2005 | Tomoyasu |
| 2006/0040415 A1 | 2/2006 | Chou et al. |
| 2006/0073619 A1 | 4/2006 | Usui et al. |
| 2006/0169410 A1 | 8/2006 | Maeda et al. |

* cited by examiner

Fig 1
Prior Art Parallel Plate PECVD System (schematic)

Fig 2
Showerhead Assembly Detail

Fig 3 Showerhead hole. Enlarged view

Fig 4
Prior Art Baffle plate

Fig 5
Oxide deposition process emission spectrum

Fig 6
Variation of Emission Intensity with Time

Fig 7
Variation of Film Thickness with Time

Fig 9
Run to Run Variation of Film Thickness

OPTICAL EMISSION INTERFEROMETRY FOR PECVD USING A GAS INJECTION HOLE

CROSS REFERENCES TO RELATED APPLICATIONS

This application claims priority from and is related to commonly owned U.S. Provisional Patent Application Ser. No. 60/709,469 filed Aug. 18, 2005, entitled: Optical Emission Interferometry for PECVD using a Gas Injection Hole, this Provisional Patent Application incorporated by reference herein.

FIELD OF THE INVENTION

The present invention relates to plasma processing apparatus, and in particular to plasma reactor systems having an optical monitoring and control system for monitoring and controlling plasma processing.

BACKGROUND

Plasma processes are used extensively in the manufacture of semiconductor devices and silicon-based micro-circuits. They are also used in other non-semiconductor applications, such as waveguide and optical device fabrication and in many non silicon-based devices (devices based on III-V materials such as GaAs).

Plasma processing falls into two general categories, namely etching and deposition. In the technique of plasma etching, a substrate is exposed to a reactive gas plasma and material is removed from the surface by the formation of a volatile by-product. By patterning the substrate with a non-erodable mask, a pattern can be effectively transferred into the substrate surface layer. In plasma deposition (Plasma Enhanced Chemical Vapor Deposition (PECVD)), gaseous precursors are introduced into a low pressure plasma where reaction occurs to produce a solid by product which deposits on the substrate as a thin film. For example, $SiH_4$ and $N_2O$ are commonly used to produce a $SiO_2$ film.

For both techniques, it is important to terminate the process at an appropriate time, or "end point." For an etching process this may be the point at which a particular layer has been removed, while for a deposition process it may be the point at which a desired film thickness has been deposited. A number of end point methods based on optical techniques have been described.

Optical Emission Spectroscopy (OES) relies on monitoring the radiation emitted by the plasma and correlating changes in the emission at particular wavelengths with changes in the plasma. Such changes occur as a film is etched and removed since this produces a variation in the plasma composition. This technique is applicable to detecting etch end point, but since no such change occurs as a film is deposited, it is not useful for determining the film thickness in a deposition process.

Interferometry can be used to measure the thickness of a film by measuring the change in magnitude of reflected light that occurs due to interference of light reflected from the top and bottom surfaces of the film. As the film thickness changes (either decreasing in the case of an etching process, or increasing in a deposition process) the intensity of the reflected light varies in a cyclical manner, with the thickness d, corresponding to 1 cycle being given by:

$$d = \lambda/2n$$

where:

$\lambda$ is the wavelength of the reflected light; and n is the refractive index of the film at the specified wavelength.

The source of the light which is reflected is commonly provided externally (such as a laser or a continuum source). However, the plasma itself can act as the source, in which case the technique is referred to as Optical Emission Interferometry (OEI). In principal the technique will work for both etch and deposition processes.

Common to all optical techniques is the need to provide an optically transparent and vacuum tight window which is necessary to monitor the emitted or reflected radiation. For OEI, the window is ideally located such that plasma emission reflected normally from the substrate surface is viewed. However, to be effective, the presence of this window should not locally perturb the plasma, since this will affect the area of the substrate which is being monitored. This is particularly true in a parallel plate PECVD system where a close electrode spacing is employed to maintain good film quality. Further, for the technique to function correctly over long periods of time, the window must remain optically clear in the presence of reactive plasma and process by-products.

The use of OEI as an endpoint technique in an etching process has been described by Curtis (U.S. Pat. No. 4,328,068). The light pipe used to collect the plasma emission intrudes into, and hence disturbs, the plasma. Also, no provision is made to prevent degradation of the optical components over time due to the etch process.

Likewise Auda et al. (U.S. Pat. No. 5,223,914) describe using a spectrometer in an interferometric mode to measure film thickness during an etch process. The plasma is viewed through a quartz window which has no provision for protection from the plasma environment. Neither Curtis or Auda et al. consider monitoring a deposition process.

Sawin et al. (U.S. Pat. No. 5,450,205) use OEI to monitor multiple points across the surface of a processed wafer using a charge-coupled device (CCD) detector array. This necessitates a large (50 mm) window, which is acceptable for the etch applications discussed, but is unacceptable for a parallel plate PECVD application. The plasma is viewed through a window which has no provision for protection from the plasma environment.

Pirkle et al. (U.S. Pat. No. 5,846,373) describe the use of OEI to measure film thickness in a deposition process. The plasma is viewed through a window mounted in the chamber wall, but there is no provision to protect the window from deposition.

Chen et al. (U.S. Pat. No. 6,071,375) discuss protecting a wall mounted window by means of a purge gas flow through a pre-chamber located between the plasma and the window. Chen et al. do not teach placing the window within an electrode and the configuration is not applicable to a parallel plate PECVD system.

Ookawa et al. (U.S. Pat. No. 6,758,941) describe a window located in a showerhead gas distribution electrode. The window is protected from the plasma environment by means of high aspect ratio apertures located in the electrode. In a close electrode spaced configuration, such as parallel plate PECVD, such features will locally disturb the plasma.

What is needed is a means of mounting a window into a parallel plate PECVD system such that the window does not disturb the plasma and which allows plasma emission to be viewed normal to the wafer, permitting film thickness measurement using OEI.

Therefore, there is a need for improving the optimization of process state functions of a plasma etch process.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a plasma apparatus for processing a substrate comprising: a vacuum chamber; at least one power supply for generating the plasma in said vacuum chamber; a substrate pedestal for supporting the substrate; an upper electrode assembly having a gas distribution system having a plurality of standard showerhead holes; a detector in optical communication with at least one of said standard showerhead holes, said detector measuring the plasma emission transmitted through said standard showerhead holes; a control system in electrical communication with said detector and said power supply; and optical components positioned in said upper electrode assembly for viewing the plasma emission transmitted through said showerhead holes.

Yet another object of the present invention is to provide a method for monitoring plasma processing of a substrate, the method comprising the steps of: positioning the substrate on a substrate pedestal within a vacuum chamber; introducing a gas through a plurality of standard showerhead holes of a gas distribution system of an upper electrode assembly; generating a plasma from said gas within said vacuum chamber; monitoring said plasma during plasma processing of the substrate, said monitoring occurring by collecting and measuring the plasma emission transmitted through at least one standard showerhead hole, using optical components positioned within said gas distribution system of said upper electrode assembly; and terminating said plasma based on said monitoring step.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method and apparatus for improving optical sensing of a plasma process through a standard showerhead hole of a standard gas showerhead positioned in an upper electrode of a plasma system during the plasma processing of a substrate.

A feature of the present invention is to provide a plasma apparatus for processing a substrate comprising a vacuum chamber and at least one power supply for generating the plasma in the vacuum chamber. The vacuum chamber having a substrate pedestal for supporting the substrate and an upper electrode assembly. Both the substrate pedestal and the upper electrode assembly can be RF powered and/or RF grounded. A standard gas distribution system having a plurality of standard showerhead holes is provided in the upper electrode assembly. At least one fiber optic sensor is positioned within at least one of the standard showerhead holes of the standard gas distribution system. A signal (a measure of the plasma emission generated during the plasma processing of the substrate) received by the fiber optic sensor can be reflected from the surface of the substrate or other known material within the vacuum chamber. The fiber optic sensor can be aligned so that the signal received is normal to the surface of the substrate. Also provided is a control system that is in electrical communication with the fiber optic sensor and the power supplies that are generating the plasma within the vacuum chamber in order to terminate and/or adjust the plasma process in response to the readings (measurements) received through the fiber optic sensor. In addition, a window is provided that is positioned in the upper electrode assembly for viewing the plasma emission through the standard showerhead hole.

Another feature of the present invention is to provide a method for monitoring plasma processing of a substrate. The method comprising the steps of positioning the substrate on a substrate pedestal within a vacuum chamber. A process gas is introduced into the vacuum chamber through a plurality of standard showerhead holes of a gas distribution system of an upper electrode assembly. The showerhead can be grounded and/or RF powered. A plasma is generated within the vacuum chamber from the process gas. Optical emissions of the generated plasma are monitored during the plasma processing of the substrate. At least one fiber optic sensor that is positioned within at least one of the standard showerhead holes of the gas distribution system of the upper electrode assembly is used to monitor the plasma processing of the substrate. A signal (a measure of the plasma emission generated during the plasma processing of the substrate) received by the fiber optic sensor can be reflected from the surface of the substrate or other known material within the vacuum chamber. The fiber optic sensor can be aligned such that the signal is normal to the surface of the substrate. Also provided is a control system that is in electrical communication with the fiber optic sensor and the power supplies that are generating the plasma within the vacuum chamber in order to terminate and/or adjust the plasma process in response to the readings (measurements) received through the fiber optic sensor. A film property can be calculated based on the measured plasma emission from the surface of the substrate. The film property can be film deposition rate, refractive index, film thickness, etc. The plasma emission from the plasma processing of the substrate can be measured at a wavelength of 300 to 400 nanometers. Based on the measured film property, the plasma processing of the substrate can be adjusted and/or terminated. The plasma processing of the substrate can be an etch and/or a deposition process. A nitrogen containing gas can be introduced during the plasma processing of the substrate. In addition, a window is provided that is positioned in the upper electrode assembly for viewing the plasma emission through the standard showerhead hole.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

What is disclosed is a means of mounting a window into the upper, RF powered electrode of a parallel plate PECVD system, the electrode acting as a showerhead gas distribution means, and viewing the plasma emission reflected from the substrate through a standard showerhead hole.

Figure 1:
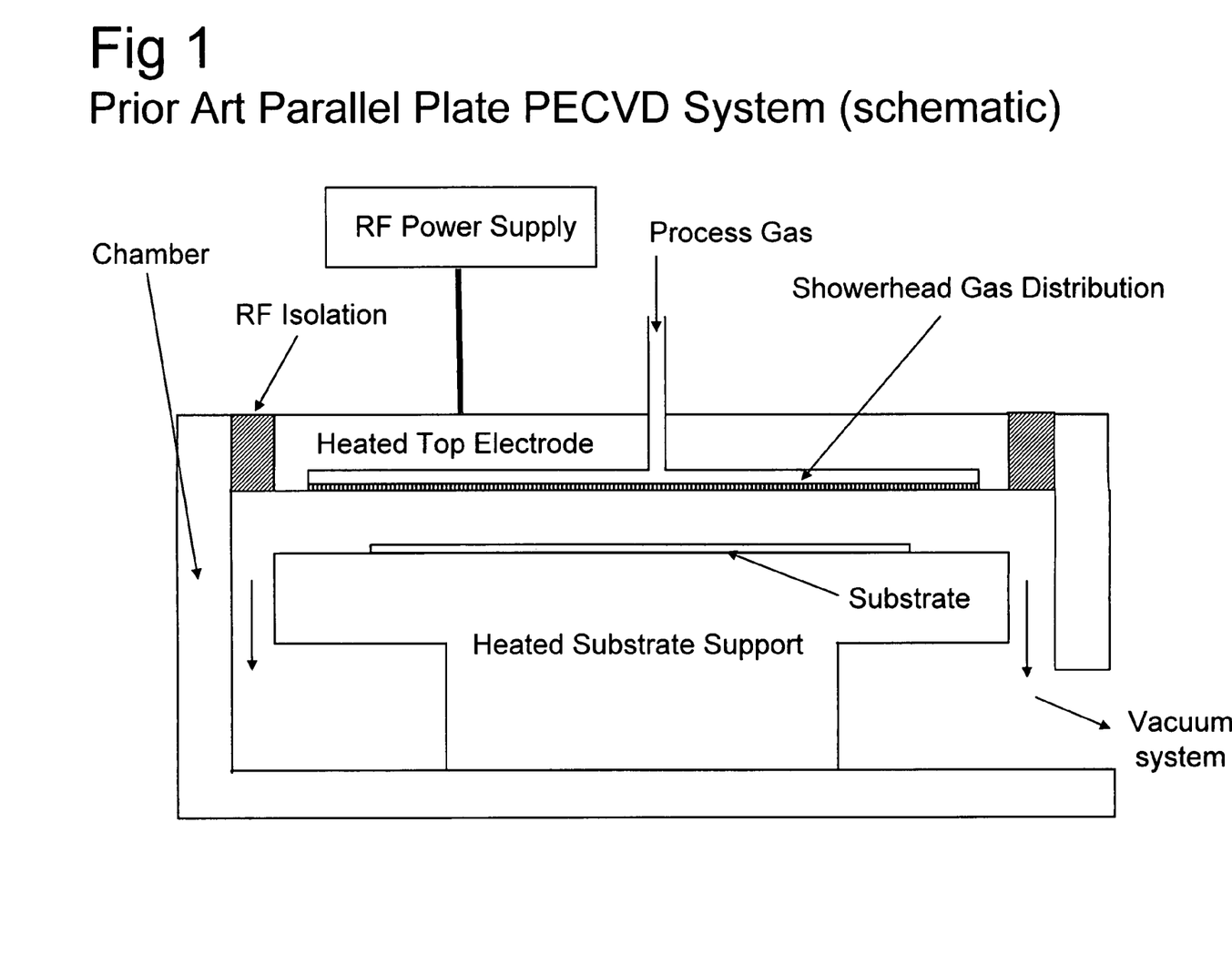
FIG. 1 is a schematic of a typical prior art parallel plate PECVD system.
Figure 2:
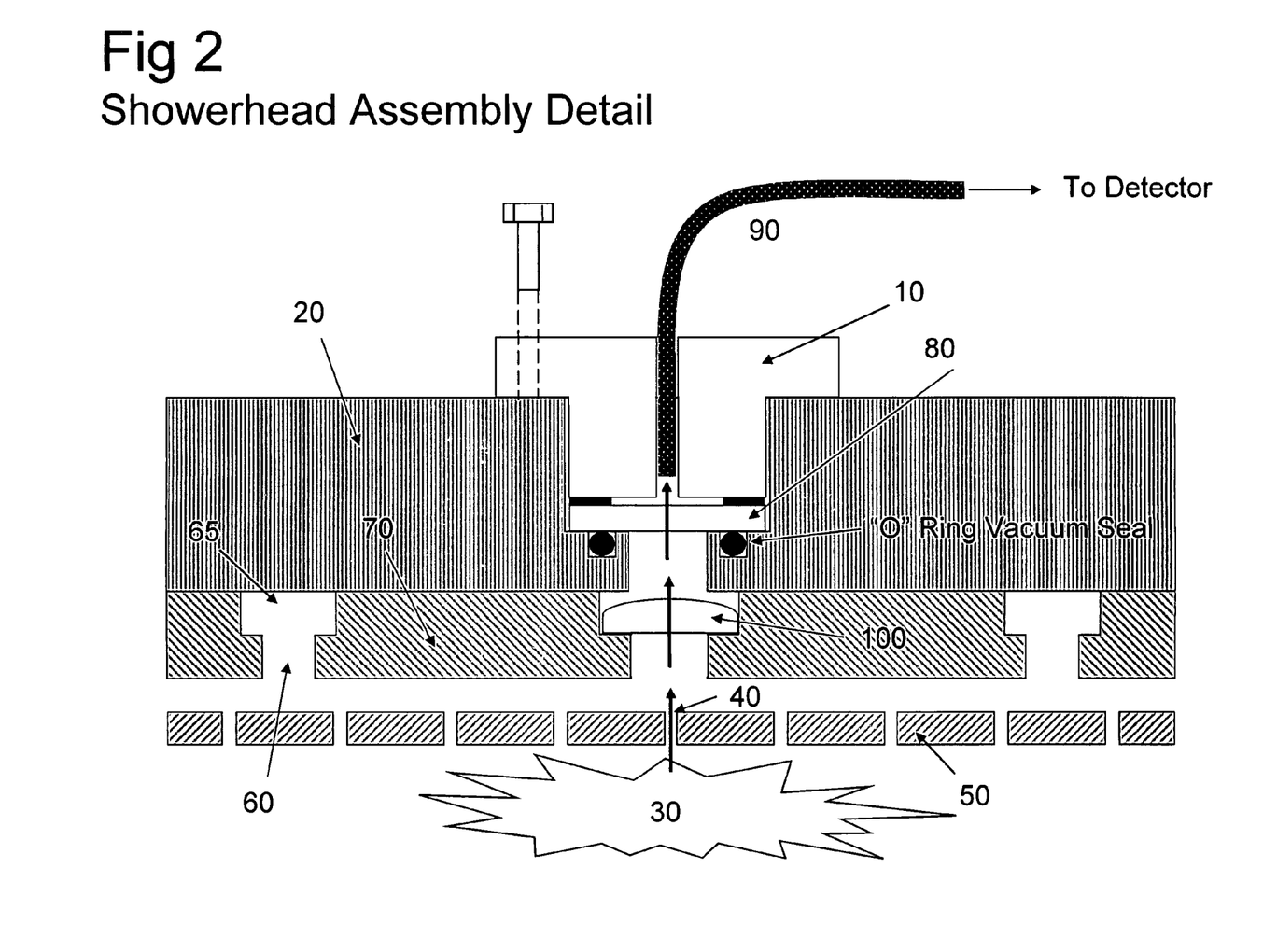
FIG. 2 is a blown up schematic of a standard showerhead assembly of a plasma system using the fiber optic sensor positioning of the present invention.
Figure 4:
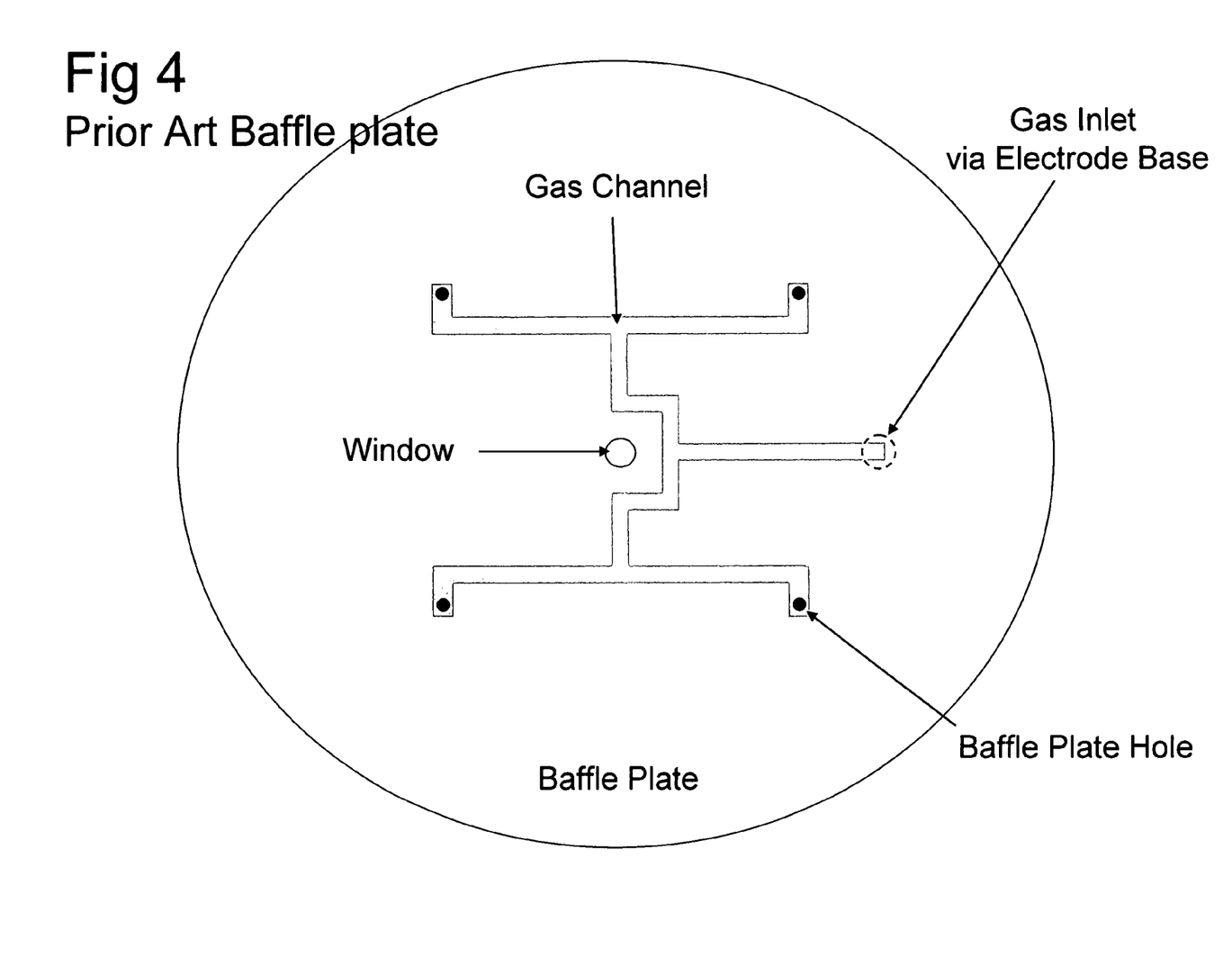
FIG. 4 is an enlarged view of a standard prior art baffle plate showing the gas inlet via the body of the electrode.

FIG. 1 shows a schematic cross section of a typical PECVD system. A vacuum chamber contains a lower heated electrode which acts as a substrate support. The electrode is usually RF grounded, but may optionally be RF powered, either at the same frequency as the upper electrode or at a higher or lower frequency. An upper heated electrode has RF power applied by an impedance matching network (not shown), and a plasma is generated in the region between the two electrodes. If the lower electrode is RF powered, the upper electrode may optionally be RF grounded. Process gas is introduced into the chamber through the upper electrode and is evenly dispersed over the substrate area through numerous small holes within the electrode, constituting what is commonly referred to as a "showerhead." The exact size and distribution of the showerhead holes is dependent on the specific process parameters used for deposition, but hole diameters in the range 0.010" to 0.050" are frequently used for a standard showerhead. Such a design is well known in the art and may also involve using an intermediate gas dispersion "baffle plate" (FIGS. 2,4). The process gas is pumped from the chamber using an appropriate pumping system (not shown) incorporating a throttle valve which allows the process pressure to be controlled.

For PECVD, it is common for the process pressure to be in the range 1 Torr up to several Torr. In order to maintain a stable, uniform plasma at these pressures, the electrode spacing is of the order of a few centimeters down to a few millimeters. A similar configuration may also be used in etch applications when a close electrode spacing is desired. With such a small electrode spacing it is not possible to utilize a conventional viewport to monitor the plasma, since the presence of the viewport will perturb the plasma.

FIG. 2 shows an example of the present invention which incorporates optical components located in the electrode body 20 which allow the plasma emission 30 to be monitored through a standard showerhead hole 40 of a showerhead 50. Plasma emission 30 passes through the showerhead hole 40, through a hole 60 in the baffle plate 70, through a transparent window 80 and is collected by an optical fiber 90 positioned within the viewport 10. The emission may also be collected directly by the optical fiber 90 without the need for window 80, though this is a less optimal solution since this requires that the fiber must also be vacuum sealed into the electrode body 20. A lens 100 is optionally positioned in the baffle plate 70 to increase the amount of light reaching the optical fiber 90. The optical fiber 90 typically has an acceptance angle for radiation of the order of 30 degrees. Consequently, it is not necessary to critically align the optical fiber 90 with the viewport 10 to ensure efficient transfer of the light emitted from the plasma, 30. The optical fiber 90 couples the plasma emission 30 to a suitable radiation detector (not shown). This may also comprise a filter or series of filters, or a wavelength dispersive component (prism or grating) such that radiation at different wavelengths can be measured. Conveniently, the detector comprises a multi-channel spectrometer (such as model S2000 as manufactured by Ocean Optics) that permits simultaneous detection over a wavelength range of 200 nm to 850 nm.

In normal operation, the volume behind the showerhead 50 is filled with process gas which is introduced through gas channels 65 and holes 60 in the baffle plate 70 and exits into the plasma region through the holes 40 in the showerhead 50. No plasma exists within this volume and so the window 80 (and lens 100, if present) are only exposed to non-reacted process gas and do not suffer any degradation due to erosion or deposition of plasma by products. There is no requirement to provide specific protection of the window 80 by additional shielding or gas purging. The protection generated by the normal process gas flow, which includes all of the process gas (of the order of 0.1-10 liters/min), ensures that the window 80 is only exposed to a clean environment. Likewise, there is no requirement to modify the specific showerhead hole 40 which is used to monitor the plasma emission 30. Showerhead hole 40 is a standard showerhead hole which is optimally identical to other adjacent showerhead holes. Thus, there is no local variation in the gas distribution and no disturbance of the process. The lack of any showerhead hole 40 modifications to view the plasma emission 30 or additional hardware to protect the window 80 means that the present invention is easily incorporated into a complex fixture (in this instance into a high temperature and RF powered electrode) and its presence does not disturb the plasma, and hence the process, in any way.

Figure 3:
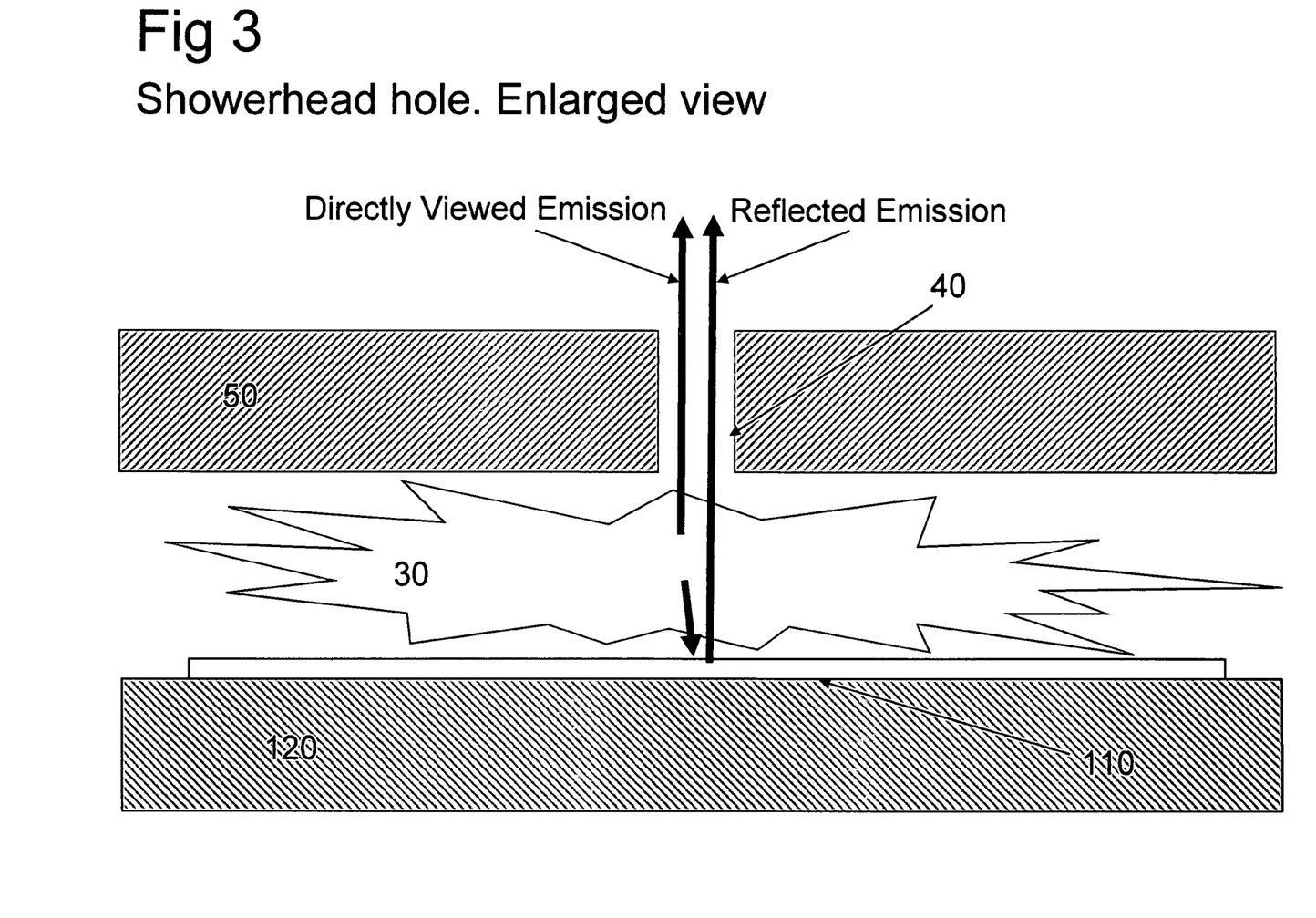
FIG. 3 is a blown up schematic of a standard showerhead hole of a plasma system using the fiber optic sensor positioning of the present invention.

FIG. 3 illustrates an enlarged view of a standard showerhead hole 40 and shows that both direct plasma emission 30, and plasma emission 30 reflected from the substrate 110 (that is positioned on the substrate pedestal 120) pass through the showerhead hole 40 and are received by the optical fiber 90 and the detector.

FIG. 4 illustrates an enlarged view of a prior art baffle plate showing the gas inlet via the body of the electrode.

Figure 5:
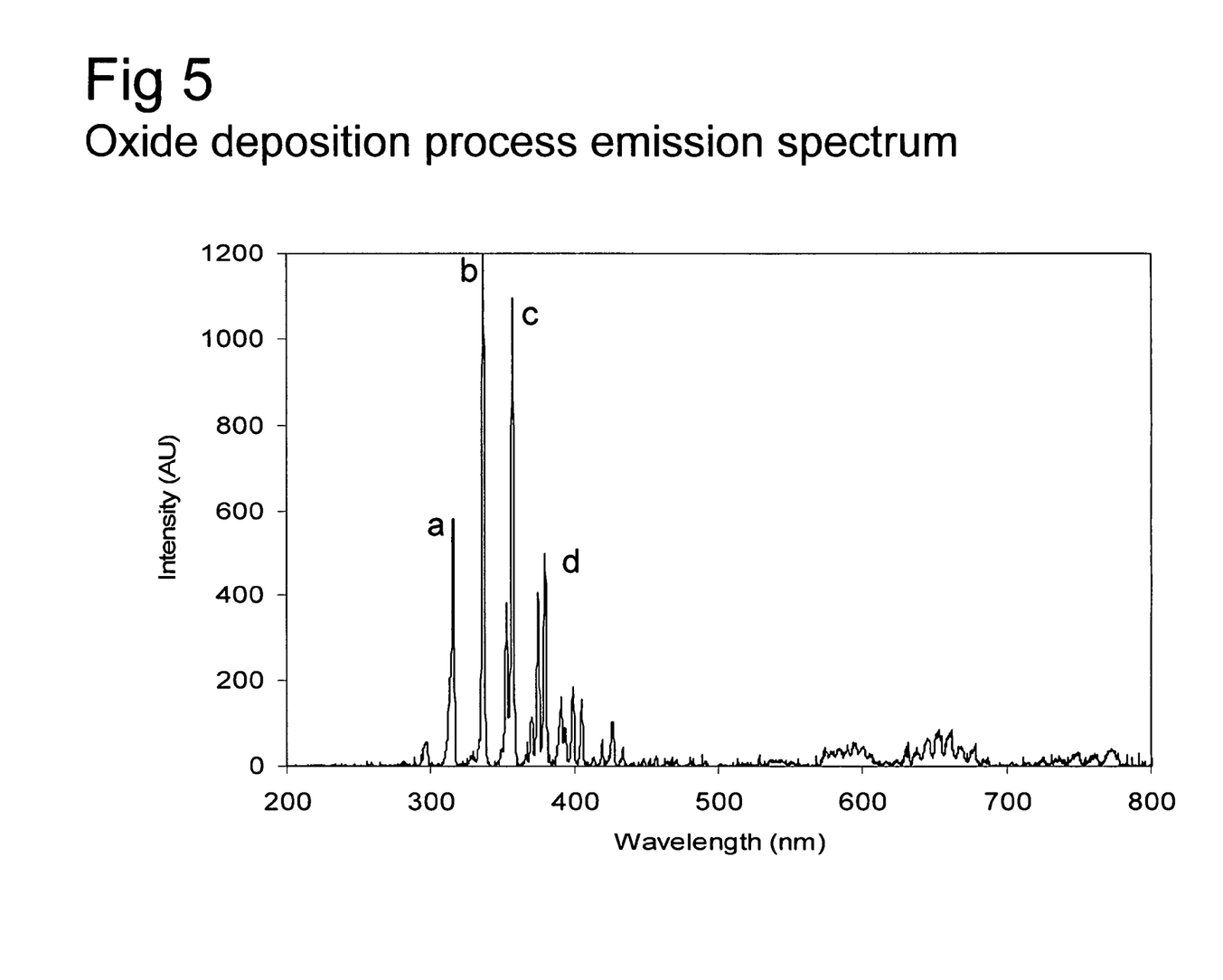
FIG. 5 shows a graph of the spectrum observed through the showerhead hole when a typical silicon dioxide deposition process is used.

FIG. 5 shows the spectrum observed through the showerhead hole when a typical silicon dioxide deposition process is used. Despite the small hole dimensions and the limited amount of radiation passing through the hole, the arrangement is sensitive enough to provide an adequate signal for further analysis.

Figure 6:
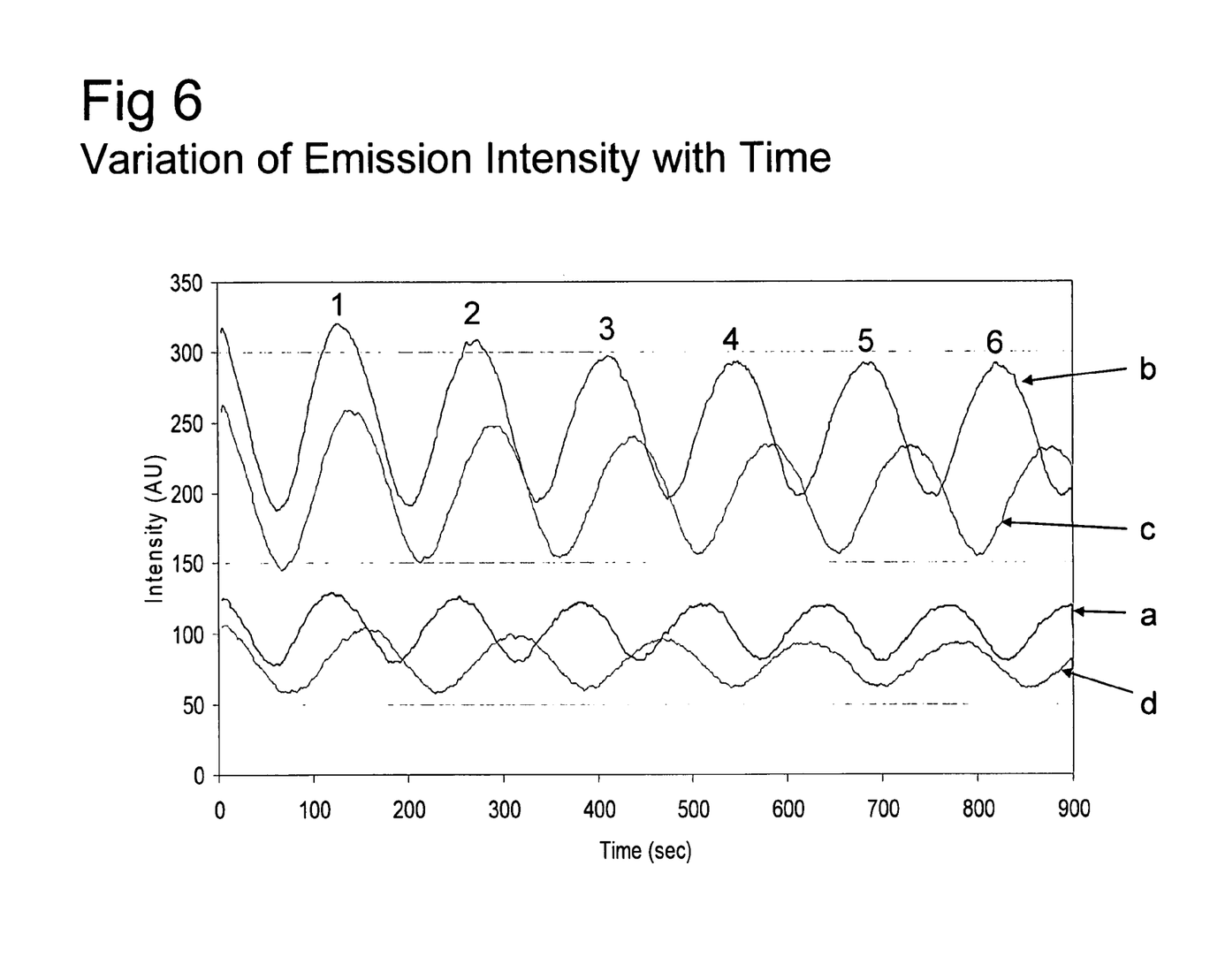
FIG. 6 is a graph of the variation of plasma emission intensity over time.

The spectrum of FIG. 5 is mainly that of $N_2$ which is a major constituent of the deposition process used. A number of prominent molecular emission bands in the region of 300 nm to 400 nm are observed, and are labeled a, b, c, d. Because part of the detected spectrum is reflected from the substrate surface, interference in the signal occurs due to reflections at the thin film surfaces. This is true whether the substrate has a simple reflective surface (such as a silicon or GaAs wafer) or has complex reflections due to topography present from previous patterning operations. Hence, during the deposition of a silicon dioxide film the intensity of these bands varies with time in a cyclical manner as the film grows in thickness. This is shown in FIG. 6.

The wavelength of the emission bands discussed above are listed in Table 1, together with the calculated thickness corresponding to one cycle in the reflected intensity.

TABLE 1

Interference period for silicon dioxide film (nf = 1.46)

| Wavelength | Cycle Thickness (Å) |
|---|---|
| "a" = 315.9 nm | 1082 |
| "b" = 337.1 nm | 1154 |
| "c" = 357.7 nm | 1225 |
| "d" = 380.5 nm | 1303 |

The thickness are based on pre-measuring or pre-assigning the refractive index of the film, which in the example given for a silicon dioxide film is 1.46. Knowing this value, it is straightforward to determine the film thickness from the data of FIG. 6. For the emission band "b" (wavelength=337.1 nm) the cycles are labeled 1-6 in FIG. 6, and the film thickness corresponding to each cycle is listed in Table 2.

TABLE 2

Film Thickness at 337.1 nm

| Cycle Number | Film Thickness (Å) |
|---|---|
| 1 | 1154 |
| 2 | 2308 |
| 3 | 3462 |
| 4 | 4616 |
| 5 | 5770 |
| 6 | 6924 |

Figure 7:
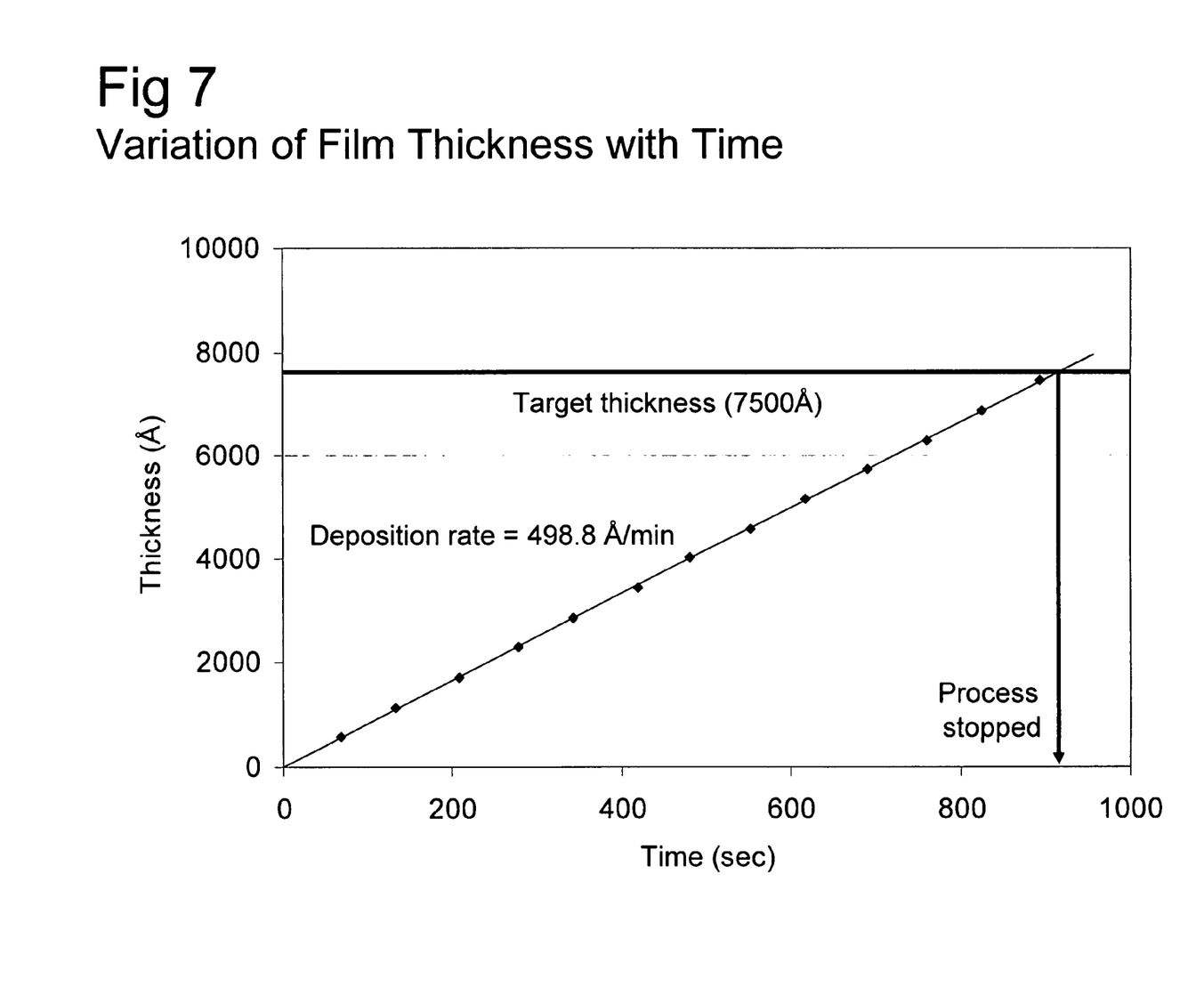
FIG. 7 is a graph of the variation of film thickness over time.

Similarly, the film thickness corresponding with half cycles can be determined. The time in the process at which these points occur can be determined by detecting the local maximum or minimum in the signal by, for example, detecting the time at which the differential of the signal is zero, but other well known peak detection algorithms may be employed. It is then possible to determine in situ film thickness versus time as the process proceeds, as shown in FIG. 7, and from this the deposition rate. Knowing the time t and the thickness d for the last cycle (or half cycle), the deposition rate, $R_d$, is simply equal to d/t. A more accurate determination of $R_d$ can be made by performing a linear regression analysis on the time/thickness data. This value can be updated each time a half cycle is detected. The film thickness T, at any time in the process, $t_{process}$ is then:

$$T = R_d \times t_{process}$$

For very thick films, $R_d$ may change with time due to the deposited film affecting the plasma characteristics, in which case a polynomial analysis is more appropriate.

Other means may be used to extract film thickness data from the interference signal. Peak counting and interpolating/extrapolating between peaks is well known. Transforming the data to the frequency domain and performing, for example, a Fourier Transform on the data to determine the frequency (and hence cycle time) of the signal can also be used. From the cycle time, the deposition rate and film thickness at any time are simply calculated as outlined above.

It is not necessary to limit the measurement to a single wavelength, but multiple wavelengths (a, b, c, and d in the current example) can be monitored and analyzed simultaneously. This provides more data points and a more accurate determination of the deposition rate. Additionally, having data at a large number of wavelengths may permit other properties of the film, such as refractive index or film absorption (n and k values) to be determined.

The emission may also be viewed through two or more showerhead holes. If such holes are located at different points above a substrate, then the local deposition rate can be measured, and from this measurement the process uniformity can be determined. If at least one of the holes is located away from the substrate, then the emission transmitted through that hole has only the direct plasma emission component and no contribution from reflection from the substrate (FIG. 3). This direct component can be utilized as a "background" signal and subtracted from the direct signal plus the reflected signal received from above the substrate. This allows the reflected-only signal to be directly measured. The measurement at multiple points can be made using multiple detectors, or by using a single detector which alternately samples the emission transmitted by the separate fibers.

Although the above example is given for a silicon dioxide film, monitoring $N_2$ bands, the technique is equally applicable to other films such as silicon nitride, silicon oxynitride amorphous silicon, diamond-like carbon (DLC) or other organic polymer films, and to other wavelengths, which are determined by the specific process utilized.

Although the examples given are based on monitoring a deposition process, the technique is equally suited to monitoring the change in thickness in an etch process, which may include RIE, PE, ICP or other well known etch techniques, or even in processes employing alternating etch and deposition steps (e.g., "Bosch" or time division multiplexed (TDM) processes).

EXAMPLES

An accurate measurement of the film thickness in real time permits the process to be terminated when a pre-determined film thickness has been achieved. This is shown in FIG. 7 where the process is terminated when a target film thickness of 7500 Å has been achieved. The deposition rate of 498.8 Å/min was determined using a linear regression analysis.

The advantage of terminating the process based on this technique over the conventional method of terminating by time is that better run to run repeatability is obtained, resulting in devices with a more consistent performance. From run to run, the deposition rate will normally change slightly due to film accumulation, which will change the reactor characteristics. Terminating a process at a fixed time inevitably results in a film thickness which also changes from run to run. Additionally, it is necessary to clean a system periodically to remove the accumulated film using a plasma clean process. After this procedure, it is usually necessary to re-qualify the deposition rate since a shift in the process is observed as a result of the cleaning cycle. This results in unproductive down time for the equipment.

To demonstrate the advantage of the present invention, a series of five one micron thick films were deposited followed by a clean procedure and then a second series of five one micron thick films were deposited. The process was terminated in all cases after nine interference cycles of the emission at 337.1 nm were observed (calculated target film thickness=1.038 microns). The time necessary to achieve this thickness varied from run to run and was recorded. From this data the deposition rate for each run was calculated.

Figure 8:
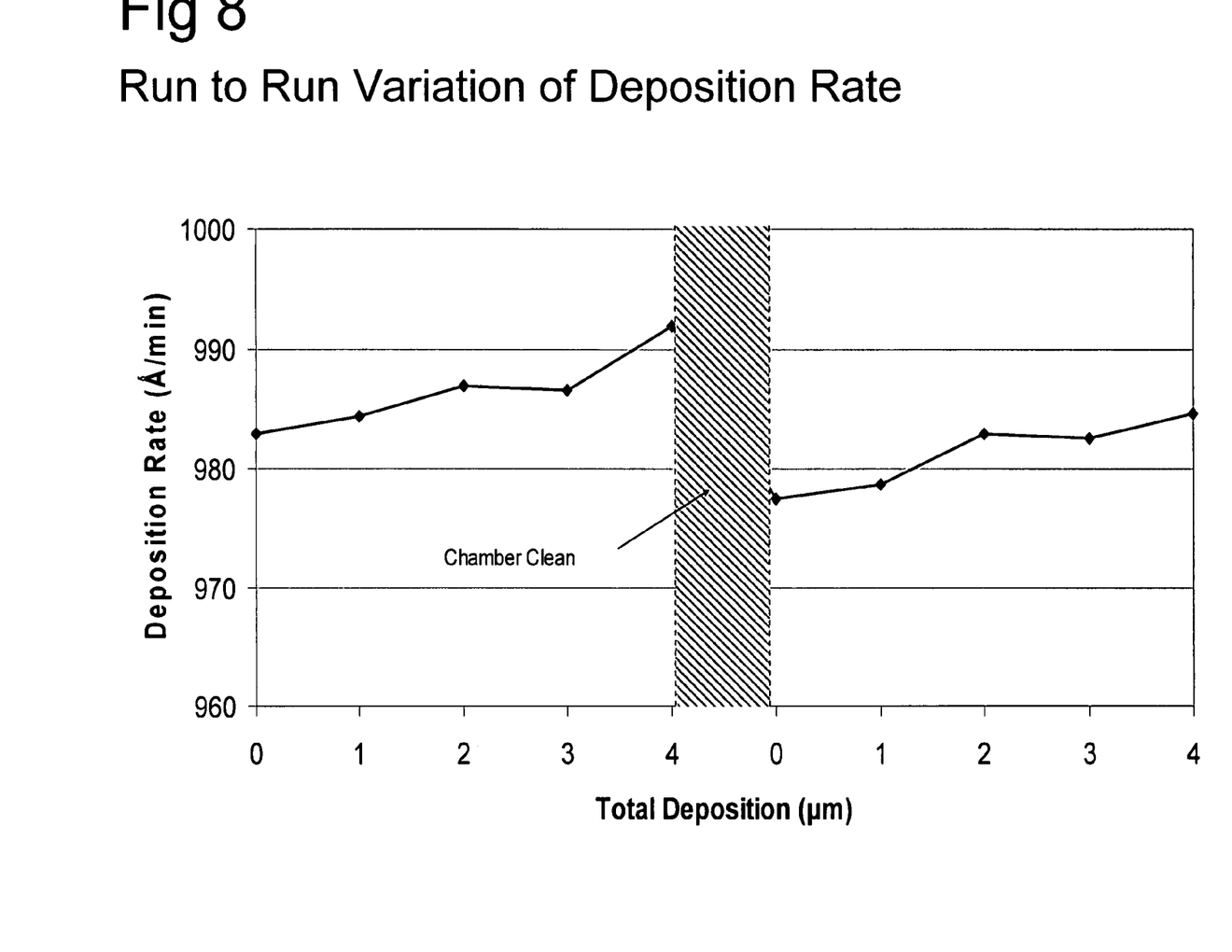
FIG. 8 is a graph of the run to run variation in deposition rate.

The run to run variation of the deposition rate is shown in FIG. 8. The rate drifts gradually as a film accumulates in the system, "resets" when the chamber is cleaned and then continues to drift again. If the process was terminated based on a fixed time, then the film thickness would follow exactly the same trends. The run to run variation is +/−0.75%. The effect is seen clearly with only five runs; the magnitude of the run to run variation will increase as the number of runs is increased.

Figure 9:
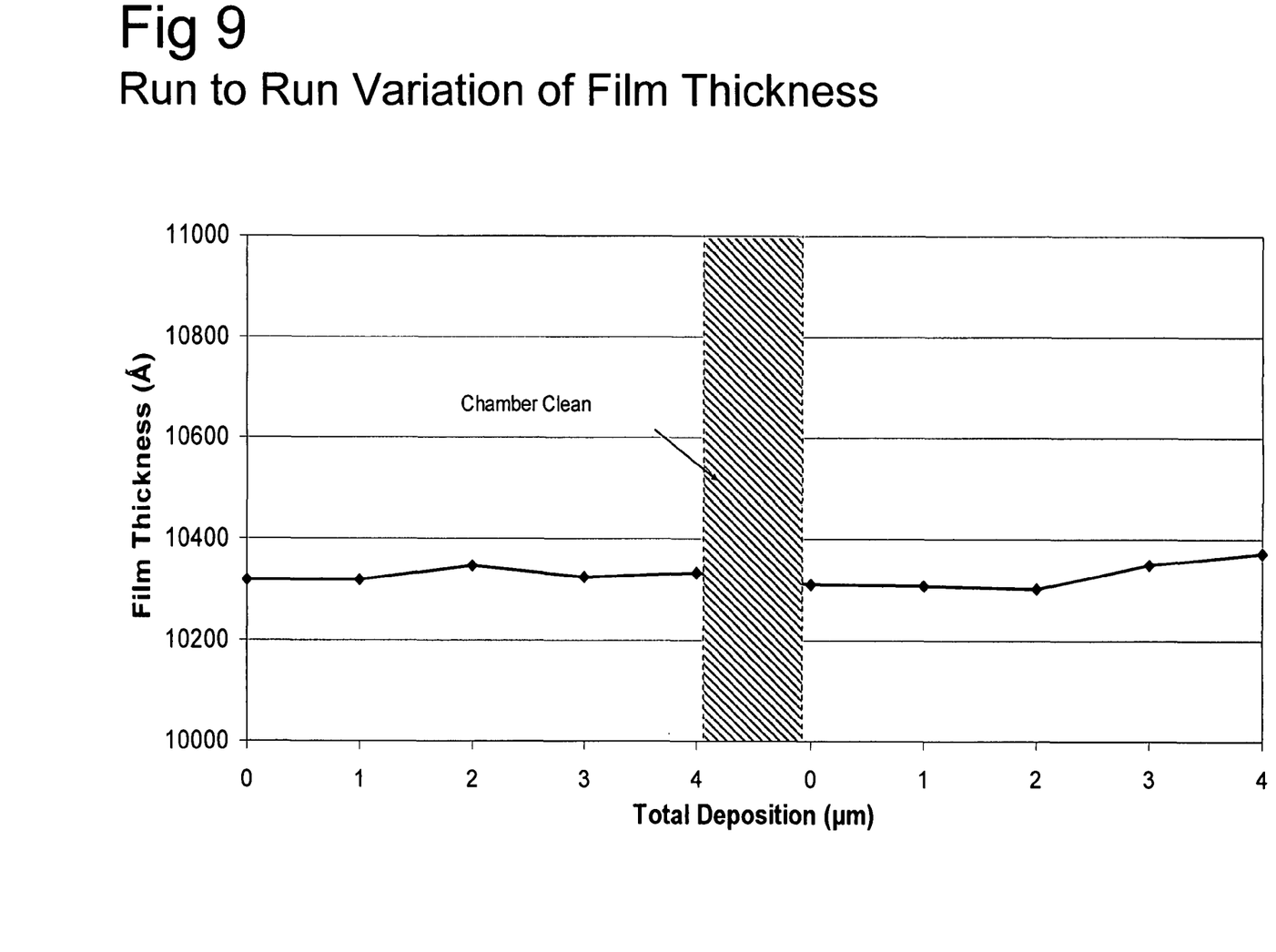
FIG. 9 is a graph of the run to run variation in film thickness.

FIG. 9 shows the actual film thickness measured, where it is clear that there is no drift over time, and specifically no change following a chamber clean. The run to run variation is +/−0.32%, a significant improvement over an approach based on a fixed time process. The improvement in the run to run variation is expected to get better as the number of runs is increased.

Another application of the present invention is for process control, other than process termination. As noted above, during the deposition of thick films, the deposition rate may change with time. Using OEI to measure the deposition rate in real time allows this information to be fed back in order to modify the process (for example change an RF power level or a gas flow rate) and compensate for such changes. Similarly, monitoring the deposition rate at multiple points allows the process uniformity to be determined, and the process can then be adjusted to control the process uniformity. If multiple wavelengths are monitored, then other film properties may be determined and the information fed back to compensate for any changes in the film property. This approach is improved by monitoring the plasma at multiple points, at least one of which is located away from the substrate. This permits the true reflection from the substrate at different wavelengths to be determined, as noted above, which is necessary to accurately determine some film properties.

An additional benefit of the present invention is that the placement of a non-degrading window within the showerhead permits conventional OES to also be performed. During a plasma clean it is normal to remove any substrates from the chamber, and hence little of the light passing through the showerhead hole and received by the detector is reflected light; rather it is light emitted directly from the plasma (as shown in FIG. 3). It is straightforward to then process the signal received by the detector using well know techniques for end point detection. As an example, when cleaning the chamber using a fluorine based process (e.g., using $CF_4$, $SF_6$ or $NF_3$) the atomic fluorine emission at 703.7 nm can be monitored; the intensity of this emission will rise as the chamber is cleaned and an algorithm which detects this rise can be used to automatically terminate the process.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described.

What is claimed is:

1. A plasma apparatus for processing a substrate comprising:
   a vacuum chamber;
   at least one power supply for generating the plasma in said vacuum chamber;
   a substrate pedestal for supporting the substrate;
   an upper electrode assembly having a viewport and a gas distribution system having a showerhead having a plurality of standard showerhead holes;
   a detector in optical communication with optical components, said optical components being positioned within said viewport above said showerhead, said optical components only exposed to non-reacted process gas, said optical components in optical communication with at least one of said standard showerhead holes, said optical components collecting plasma emission transmitted through said standard showerhead holes, said detector monitoring the collected plasma emission transmitted through said standard showerhead holes; and
   a control system in electrical communication with said detector and said power supply.

2. The apparatus according to claim 1 wherein said optical components further comprising an optical fiber.

3. The apparatus according to claim 1 wherein said window is located to transmit plasma emission reflected normally from the substrate.

4. The apparatus according to claim 1 further comprising a lens positioned in a baffle plate.

5. The apparatus according to claim 1 wherein said upper electrode is RF grounded.

6. The apparatus according to claim 1 wherein said upper electrode is RF powered.

7. The apparatus according to claim 1 wherein said substrate pedestal is RF grounded.

8. The apparatus according to claim 1 wherein said substrate pedestal is RF powered.

* * * * *